United States Patent
Happ et al.

(10) Patent No.: US 6,496,377 B1
(45) Date of Patent: *Dec. 17, 2002

(54) VEHICLE ELECTRIC POWER DISTRIBUTION SYSTEM

(75) Inventors: Lawrence R. Happ, Mundelein, IL (US); Jacek Korczynski, Niles, IL (US); Willaim R. Bailey, Glen Ellyn, IL (US); Alan Lesesky, Charlotte, NC (US)

(73) Assignee: CooperTechnologies Company, Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 08/728,511

(22) Filed: Oct. 9, 1996

Related U.S. Application Data

(63) Continuation of application No. 08/287,623, filed on Aug. 8, 1994, now Pat. No. 5,587,890.

(51) Int. Cl.⁷ ............................. H05K 1/05; H05K 7/04; H05K 7/10
(52) U.S. Cl. ................... 361/739; 361/791; 361/794; 361/803; 361/805; 361/813; 439/75; 439/76.2
(58) Field of Search ................................ 361/826, 748, 361/750, 751, 752, 760, 761, 762, 763, 764, 767, 777, 778, 796, 735, 744, 775, 780, 784, 791, 792, 794, 795, 803, 805, 813, 739; 174/260, 262, 267; 257/691, 698, 699; 439/75, 76.1, 76.2

(56) References Cited

U.S. PATENT DOCUMENTS 3,022,480 A  2/1962  Tiffany
3,029,495 A * 4/1962 Doctor ........................ 361/744
3,059,320 A  10/1962  Seabury, III et al.

(List continued on next page.)

FOREIGN PATENT DOCUMENTS

| DE | 28 34 581 A1 | 7/1980 |
| DE | 36 22 223 A1 | 1/1987 |
| EP | 0 312 415 A1 | 4/1989 |
| FR | 2 525 065 | 10/1983 |
| FR | 2 565 425 | 12/1985 |
| JP | 64-15962 | 1/1989 |
| JP | 4-134075 | 12/1992 |
| JP | 7-160315 | 6/1995 |

OTHER PUBLICATIONS

Amtsblatt EPA;Official Journal EPO;Journal officiel OEB; pp. 448–451. (No Date).

Primary Examiner—David L. Talbott
Assistant Examiner—John B. Vigushin
(74) Attorney, Agent, or Firm—Armstrong Teasdale LLP

(57) ABSTRACT

A vehicle electric power distribution apparatus is provided which includes a plurality of vertically stacked conductive circuit layers, each layer including an array of contact pads, a layer of electrically insulating plastic material between each of the conductive circuit layers, at least some of the contact pads are electrically connected to selected other contact pads of the same conductive circuit layer via integrally formed conductive traces. In addition to the stacked circuit layers the apparatus includes a plurality of conductive pins providing electrical contact between selected contact pads of different selected conductive circuit layers.

17 Claims, 8 Drawing Sheets

U.S. PATENT DOCUMENTS

| | | | |
|---|---|---|---|
| 3,072,734 A | | 1/1963 | Fox et al. |
| 3,081,416 A | | 3/1963 | Tuttle et al. |
| 3,205,298 A | * | 9/1965 | Kalt .......................... 361/784 |
| 3,250,848 A | | 5/1966 | Beelitz et al. |
| 3,287,606 A | * | 11/1966 | Schwartz .................... 361/744 |
| 3,316,618 A | | 5/1967 | Gurracini |
| 3,398,232 A | | 8/1968 | Hoffman |
| 3,470,612 A | | 10/1969 | Helms |
| 3,605,063 A | | 9/1971 | Stewart |
| 3,634,740 A | * | 1/1972 | Stevko ....................... 361/234 |
| 3,660,726 A | * | 5/1972 | Ammon et al. ............. 361/792 |
| 3,701,964 A | | 10/1972 | Cronin |
| 3,789,271 A | * | 1/1974 | Johnston ..................... 439/75 |
| 3,843,909 A | | 10/1974 | Asselborn et al. |
| 3,923,359 A | * | 12/1975 | Newsam ..................... 361/777 |
| 3,983,554 A | | 9/1976 | Goode |
| 4,044,888 A | | 8/1977 | Schachter |
| 4,057,736 A | | 11/1977 | Jeppson |
| 4,076,356 A | * | 2/1978 | Tamburro .................... 439/75 |
| 4,332,082 A | | 6/1982 | Johnson |
| 4,362,899 A | * | 12/1982 | Borrill ........................ 174/262 |
| 4,434,321 A | | 2/1984 | Betts |
| 4,471,158 A | | 9/1984 | Roberts |
| 4,480,150 A | | 10/1984 | Jones et al. |
| 4,611,879 A | | 9/1986 | Bullard |
| 4,658,334 A | * | 4/1987 | McSparran et al. ......... 361/795 |
| 4,752,254 A | * | 6/1988 | Inoue et al. ................ 439/834 |
| 4,790,763 A | | 12/1988 | Weber et al. |
| 4,820,169 A | | 4/1989 | Weber et al. |
| 4,834,673 A | | 5/1989 | Beinhaur et al. |
| 4,873,764 A | * | 10/1989 | Grimm ....................... 361/792 |
| 4,939,624 A | * | 7/1990 | August et al. ................ 439/75 |
| 5,089,937 A | | 2/1992 | Carrubba et al. |
| 5,124,882 A | | 6/1992 | Rosenberg |
| 5,241,454 A | * | 8/1993 | Ameen et al. .............. 361/744 |
| 5,266,057 A | | 11/1993 | Angel, Jr. et al. |
| 5,310,353 A | * | 5/1994 | Parrish et al. ............. 439/76.2 |
| 5,581,130 A | * | 12/1996 | Boucheron ................ 439/76.2 |
| 5,709,567 A | | 1/1998 | Gladd et al. |

\* cited by examiner

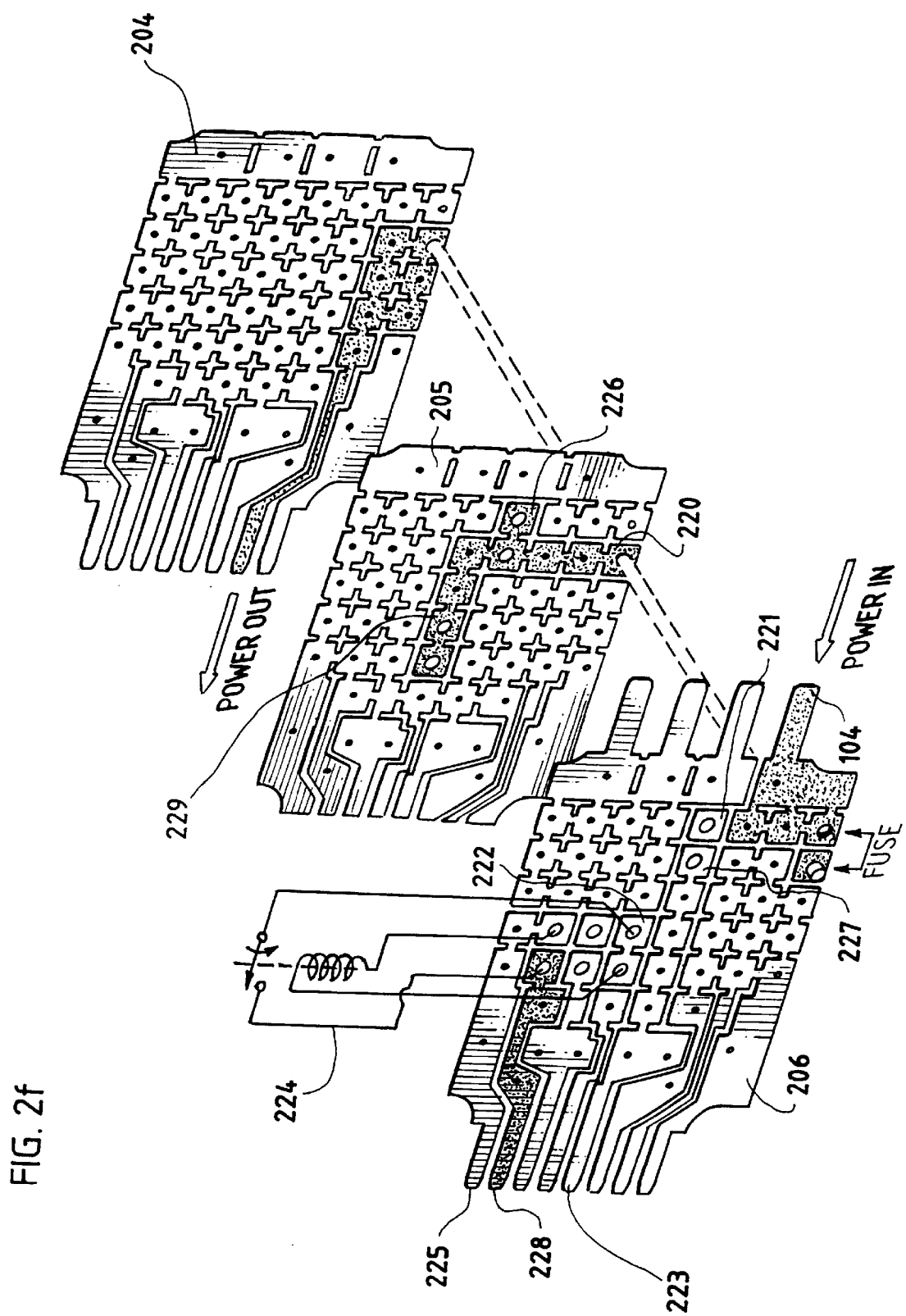

VEHICLE ELECTRIC POWER DISTRIBUTION SYSTEM

This is a Continuation of application Ser. No. 08/287,623, filed Aug. 8, 1994, now U.S. Pat. No. 5,587,890.

FIELD OF THE INVENTION

This invention relates generally to a distribution system for electrical signals, and in particular to an electrical power distribution system, and is more particularly directed toward distribution of electrical power in a vehicle.

BACKGROUND OF THE INVENTION

The first motorized vehicles had little in the way of an electrical system. All that was required was some way to generate and distribute an ignition potential to each of the cylinders of the small, internal combustion engine that powered these early vehicles.

The need to see the road ahead during nighttime operation gave rise to the first electrical accessory: headlights. Interior illumination was added for the operator's convenience, and a single tail light was considered adequate. Turn signal lights followed, but the simple vehicle radio receiver did not make its appearance until a number of years later.

The modern automobile is an impressive collection of electrical hardware: from stereo sound equipment to air conditioning; from power windows, mirrors and seats to keyless entry systems; from vehicle alarms to seat position memory to electrically heated seats. The complexity of vehicle electrical systems has grown almost exponentially since the automobile's introduction.

An automotive electrical system is a formidable combination of high-current and low-current circuitry. In many cases, relays are required for control purposes, and all circuits must be adequately fused to protect expensive components and to guard against the danger of fire. In order to facilitate the replacement of fuses and relays, and to simplify interconnection of electrical hardware, many different electric power distribution systems have been tried.

One approach that has been tried with fair consistency is to centralize fuse and relay mounting, then route input and output connections from this central location. The first systems built using this approach included a great deal of point-to-point wiring. Hand wiring is very costly, and manual wiring operations are a source of wiring errors that negatively impact product quality.

Another approach has been the construction of customized distribution networks stamped from thin metal sheets. These stampings are then contorted so that contact tabs protrude through openings in custom designed plastic shells. Although this approach yields a higher quality product, tooling costs are very high, since virtually every automobile model requires a unique distribution system. At least some of this uniqueness aspect is driven by the proliferation of fuse and relay packages. A distribution product must be able to accommodate the fuse and relay components selected by the manufacturer.

Yet another approach has centered around the use of flexible circuit board technology, or "flex circuits." Flex circuits are constructed by depositing conductive material between two flexible insulating layers. Although the unique distribution requirements of each vehicle model would require unique flex circuits for each application, tooling costs are much lower than the metal stamping/custom plastic housing approach described previously. The principal disadvantage of the flex circuit approach is that the conductive layers are very thin, and the high current densities required in vehicle power distribution lead to overheating and eventual failure.

Consequently, a need arises for a vehicle electric power distribution system that can be customized for a particular vehicle with relative ease, that avoids high tooling costs for custom designed components, that is reliable in a high current environment, that will accommodate a wide range of fuse and relay packages, and that is relatively inexpensive to manufacture.

SUMMARY OF THE INVENTION

These needs and others are satisfied by the vehicle electric power distribution apparatus of the present invention. The apparatus includes a plurality of vertically stacked conductive plates, each plate including an arrangement of contact pads, wherein at least some of the contact pads are electrically connected to selected other contact pads of the same conductive plate via integrally formed conductive traces. The inventive apparatus further includes a plurality of conductive pins providing electrical contact between selected contact pads of different selected conductive plates.

BRIEF DESCRIPTION OF THE DRAWINGS

FIG. 2(f) illustrates yet another layout of the three conductive circuit layers used in FIG. 2(d);

DESCRIPTION OF A PREFERRED EMBODIMENT

We have developed a reliable, low-cost electric power distribution system for use in a vehicle, although the invention described is not limited to vehicle applications. The invention can best be understood with reference to the accompanying drawing figures.

Figures 1A, 1B:
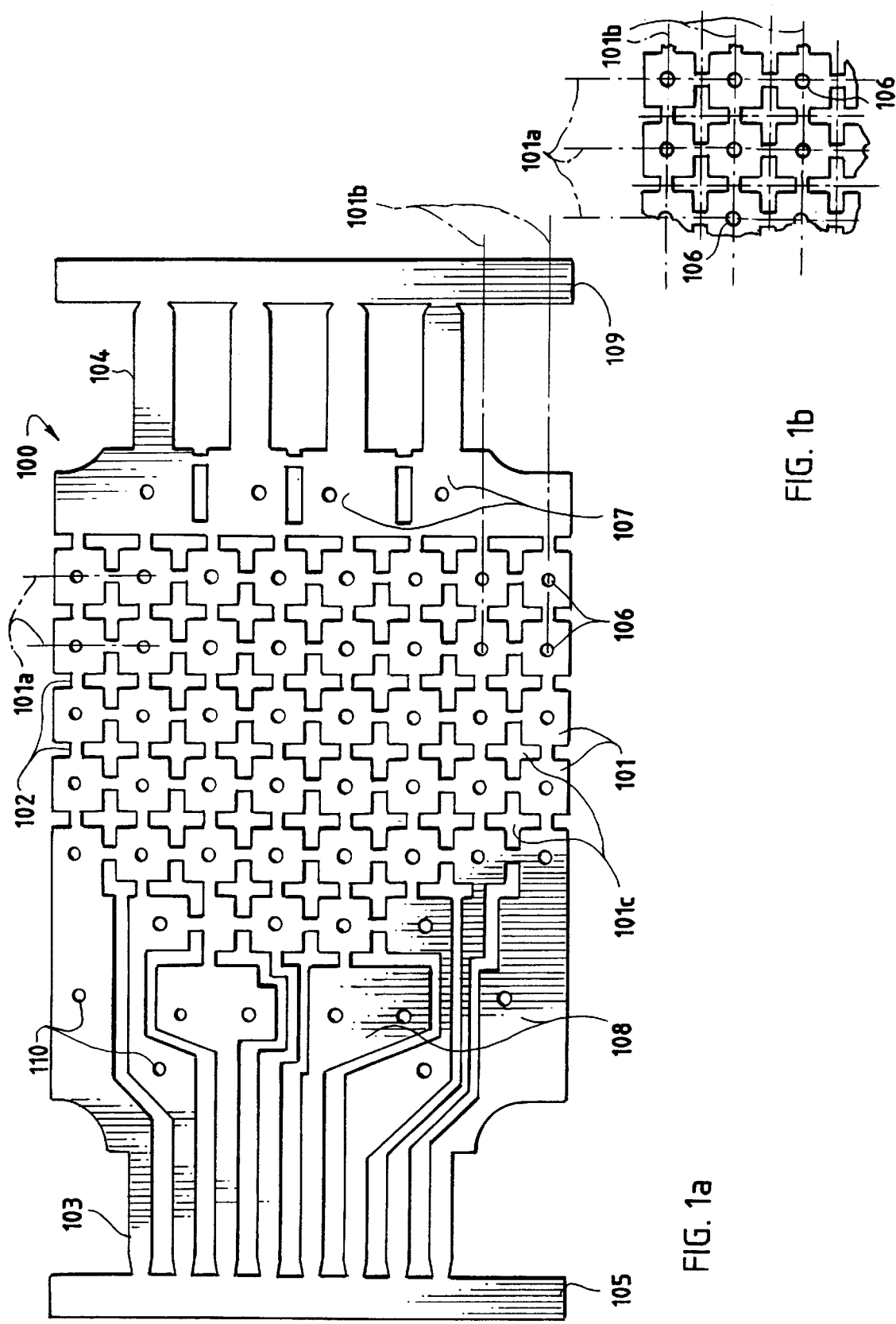
FIG. 1(a) is an enlarged top plan view of a stamped conductive plate of the present invention.
FIG. 1(b) is a partial enlarged plan view taken along line 1b of FIG. 1(a)

FIGS. 1(a) and 1(b) are top plan views of one example of a conductive circuit layer or plate prepared according to the invention, and generally depicted by the numeral 100.

Preferably, the conductive circuit layer or plate is fabricated by stamping from a conductive metal sheet having a thickness of from 0.020 to 0.050 inches. Many different conductive materials of varied thicknesses would be acceptable, depending upon the intended use of the circuit layer. For vehicle uses, the preferred metal is copper. The conductive layer shown is stamped from 0.032 inch CDA 110 half hard copper. In order to facilitate subsequent soldering operations, the conductive circuit layer is solder plated or coated to provide a solder plate thickness of about 0.0002 to about 0.0004 inch. The conductive material may be pre-plated before the stamping operation, or a plating may be added later. One of the preferred solder plating compositions for a copper base is a tin solder composition. Of course, other suitable plating compositions, known to those skilled in the applicable art, may be substituted for the solder plating just described.

A feature of the conductive circuit layer (100) is a plurality of interconnected first contact pads (101), and a plurality of second contact pads (107) and third contact pads (108). The contact pads (101) are preferably all identical, and the second contact pads (107) are generally adjacent one end of the conductive plate, while the third contact pads (108) are generally adjacent the other end of the conductive plate. The contact pads (101) are arranged to provide a right angle grid pattern as shown in FIG. 1(b). That is, vertical groups of contact pads have a vertical center lines (101A) extending parallel to each other, and the horizontal groups of contact pads have horizontal center lines (101B) extending parallel to each other. The horizontal center lines (101B) intersect the vertical center lines (101A) at right angles. The vertical center lines (101A) are each equally spaced apart from each other, and preferably spaced apart to accommodate a minifuse, such as an ATM-style minifuse manufactured by Bussman Division of Cooper Industries.

The horizontal center lines (101B) are also each equally spaced apart from each other and preferably spaced apart to accommodate a minifuse as described above. Thus, both the vertical and horizontal contact pad center lines are spaced apart the same distance. In the preferred embodiment, the contact pad center lines are spaced apart a distance of about 0.320 inch.

Of course, the rectangular array arrangement of contact pads need not be strictly adhered to. It may be discovered that a triangular, hexagonal, circular, elliptical, or other combination of these arrangements of contact pads best serves a particular application. With a triangular or hexagonal array of contact pads, for example, the coordinate system formed by the contact pad centerlines would no longer be rectangular in nature, but would form, in one instance, concentric triangles or hexagons. Centerline spacings would still be arranged to conform to the contact spacing of industry standard components.

For any array of contact pads, center-to-center spacing would be such to accommodate components with standard lead spacing (or an integral multiple of a standard spacing) in more than one direction, thus providing a great deal of component orientation flexibility.

The first contact pads (101) are shown as having a substantially rectangular shape. However, the shape of the contact pads is best determined by the ultimate use of the circuit layer. Use may dictate that the contact pads be square, triangular, circular, elliptical, or any desired shape. Although the first contact pads (101) are depicted in the figure as having holes of a uniform size therethrough, the contact pads could also be fabricated without holes, or with holes of varying dimensions. The second and third contact pads (107–108) have irregular shapes that are used to hold various other components such as relays and other size fuses.

The contact pads (101, 107–108) are shown electrically connected to selected other contact pads by integrally formed conductive traces (102). In the preferred embodiment, there are at least three conductive traces (102) for each pad (101). These conductive traces (102) are formed by the stamping die used for conductive circuit layer fabrication, although other methods of forming these traces are not precluded, and will occur to those of skill in this fabrication art. Both the conductive circuit layer and the conductive traces could be fabricated by using an etching process, for example. In application, some of these conductive traces (102) are removed by a subsequent operation to ensure that electrical connection is made only between selected ones of the contact pads (101, 107–108), as discussed in greater detail hereinafter.

The conductive circuit layer (100) also includes a plurality of electrical contacts (103) at one end of the circuit layer, and a plurality of electrical contacts (104) at the other end of the circuit layer. The electrical contacts (103–104) are preferably integrally formed during fabrication, and are coplanar with and extend outwardly from the conductive circuit layer main body section. FIG. 1 shows these contacts (103–104) as joined at a point distal from the main body of the conductive circuit layer by bars of material (105–106). The contacts are formed in this way during the fabrication process to keep the contacts from being bent or otherwise damaged. The bars of material (105–106) can be removed by a cutting operation at a later stage of manufacture. In the alternative, of course, the bars of material (105–106) need not be used at all.

Another feature is that holes (104) in the second and third contact pads (107–108) are not centered on these pads and are located to facilitate electrical connection to the conductive circuit layer in different arrangements than the rectangular array of contact pads described above. The mounting holes (104) are provided with varied spacings to accommodate electrical connection to electrical components of different sizes, and different mounting or socketing arrangements.

Figure 2A:
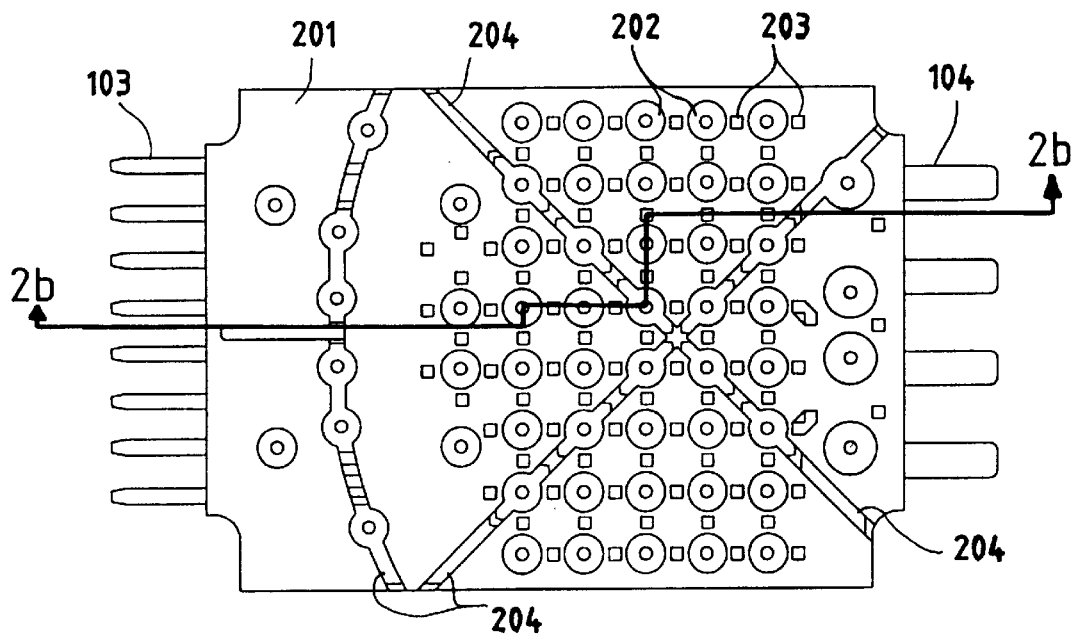
FIG. 2(a) is a top plan view of another embodiment of the present invention.
Figure 2B:
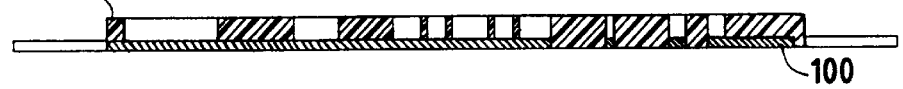
FIG. 2(b) is a cross-section view taken along lines 2(b)–2(b) of FIG. 2(a)
Figure 2C:
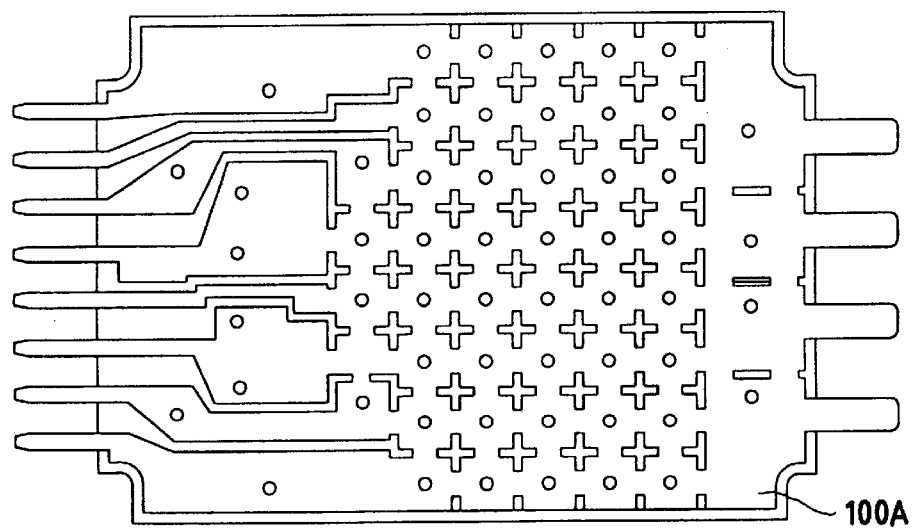
FIG. 2(c) is a bottom plan view of the conductive circuit layer of FIG. 2(a)

FIGS. 2(a)–2(c) illustrate yet other features of the present invention. These depict the conductive circuit layer (100A) without the bars (105–106), and at least partially coated with an electrically insulating material (201). In the preferred embodiment, the electrically insulating material is Rynite FR530, 94V-0, manufactured by E.I. DuPont Company and described as a PET thermoplastic polyester, but any of a number of insulating plastic or other materials would serve in this application, as is well-known in the art. Preferably, the insulating material can be applied using an injection molding process, wherein the conductive circuit layer (100A) is supported by pins or other supporting structure within the mold, and mold inserts determine the areas where the insulating material (201) is prevented from flowing. As a general statement, it can be said that the conductive circuit layer (100A) is at least partially encapsulated or coated by the insulating material, with the exception of areas (202) near the central portions of the contact pads (101), areas (203) over the conductive traces (102) that interconnect selected contact pads (101), and areas (204) as noted. These areas are kept clear of the insulating material so that the traces (102) may be easily removed and portions of the contacts removed. Also shown in FIG. 2(a) are the electrical contacts (103–104), now freed from the restraining bars of material (105–106) illustrated in FIG. 1. It should be noted that the material from which the conductive circuit layer is fabricated permits a rotation of the electrical contacts (103–104), so that the plane of one or more of the electrical contacts (103) may be made perpendicular to the plane of the conductive layer itself. Although not shown in the figure, this ability to change the plane in which one or more of the electrical contacts is oriented adds greater flexibility in terms of interconnection with external power distribution networks, which may include electrical connectors and attached electrical wires.

FIG. 2(b) illustrates the relative thickness of the insulating material (201). Preferably, as shown in the figure, the insulating material (201) extends outward from the conductive circuit layer only in one direction, although this preferred application technique need not be strictly adhered to for proper assembly. FIG. 2(b) shows the vacated areas of the circuit layer, some of which are described above, where insulating material is not permitted to flow.

FIG. 2(c) is a bottom plan view of the conductive circuit layer (100A) after the electrically insulating material (201) has been applied. As noted above, it is preferable in practicing the invention that the electrically insulating material be applied principally to only one side of the conductive circuit layer (100A). However, as has also been noted, this design practice need not be strictly adhered to for the invention to function properly.

Figure 2D:
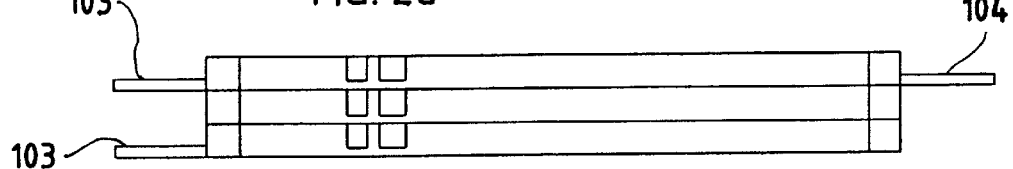
FIG. 2(d) is a side elevational view of another embodiment of the present invention.

FIG. 2(d) shows a side schematic of three conductive circuit layers (100A) stacked vertically, one on top of another, with electrical contacts (103–104) extending outwardly therefrom. In this embodiment, the middle or second circuit layer has had the contacts (103–104) removed prior to being assembled, and the bottom or third circuit layer has had one set of contacts (104) removed. Depending upon the ultimate use, selected conductors from the groups (103–104) of conductors on each circuit layer may be removed.

The insulating material that adheres to each of the conductive circuit layers prevents unwanted electrical contact between different conductive circuit layers. The insulating material also serves another purpose. The insulating layers also provide equal spacing for the conductive plates, and help maintain the conductive plates in a substantially parallel relationship.

As mentioned above, with reference to FIG. 2(a), the insulating material is deliberately kept away form certain areas; namely, the areas around the central porions of the contact pads, and the areas around the integrally formed conductive traces. This is because a subsequent shearing operation serves to selectively remove the integrally formed conductive traces between selected contact pads where electrical contact is not desired. Coating or encapsulating the conductive circuit layer in the manner described act to hold the conductive circuit layer together, even if it should become necessary to completely sever the electrical and physical connections between selected portions of the layer and the main body of the layer. Although it is not shown in the figure, the stamping operation that is used to form the conductive circuit layer can be constructed in such a way that it "kicks" portions of the conductive layer, such as the corners of the contact pads, out of the plane of the remainder of the conductive layer, so that these "kicked out" portions may be embedded more securely in the encapsulating insulating material, thus forming a stronger structure. Further, as will be discussed in more detail below, the openings previously described in the contact pads may require enlarging to conform to the inventive assembly process, and will also require soldering to ensure good electrical contact with selected other conductive layers. This is specifically why the central portions of the contact pads are left free of insulating material.

Figure 2E:
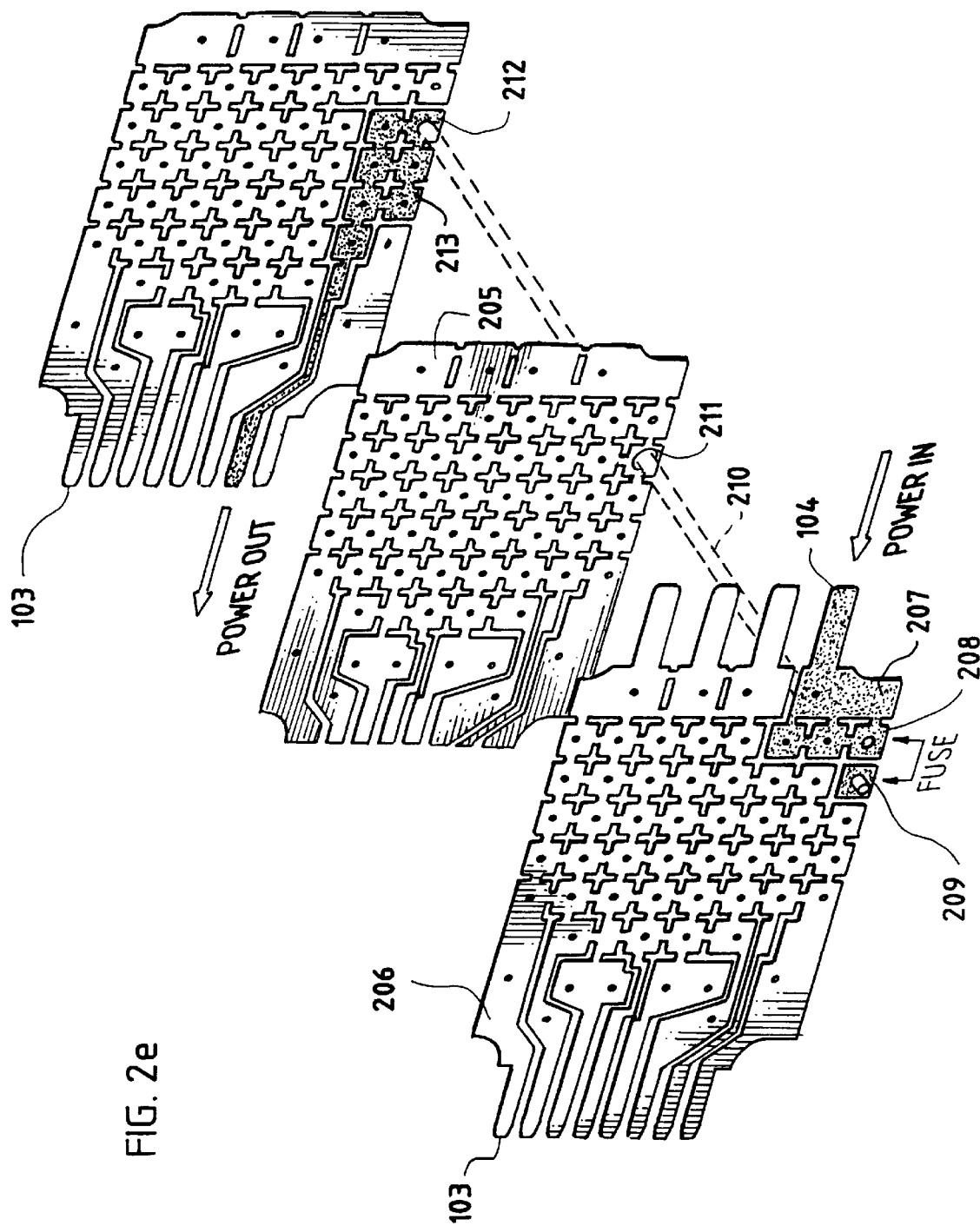
FIG. 2(e) is an enlarged view of the layout of the three conductive circuit layers used in FIG. 2(d)

FIG. 2(e) illustrates how a conductive path is formed within the apparatus. Three different conductive circuit layers (204–206) are shown in the figure. It is important to note at this point that one of the significant economies of the inventive apparatus is the fact that all conductive circuit layers are identical prior to the shearing operation that removes selected conductive traces. A single stamping tool is used to fabricate the conductive circuit layers, and a single mold-in-place operation coats or encapsulates the conductive circuit layers. It is not until the shearing operation that removes selected conductive traces that each conductive circuit layer begins to assume a unique identity.

The conductive circuit layers (204–206) of FIG. 2(e) would, in the preferred embodiment, be coated or encapsulated with insulating material prior to the shearing operation that defines specific conductive paths, but, for the sake of clarity, the insulating material is not shown. Power may be applied to an upper conductive circuit layer (206) through an electrical contact (104). Note that conductive traces that originally connected adjacent contact pads around the periphery of the shaded area (207) of the upper conductive circuit layer (206) have been removed by a shearing operation, so that the shaded area (207) is electrically isolated from the surrounding region. The conductive path leads to a first contact pad (208), to which an electrical connector (not shown) would ordinarily be affixed to accommodate one terminal of a fuse, as indicated. A second adjacent contact pad (209) has also been electrically isolated from the remainder of the shaded region (207), so that another electrical connector may be provided to contact the remaining terminal of the fuse. Of course, electrical connectors are generally provided as a part of a conductive pin penetrating the conductive layers. For the sake of clarity, only one of the conductive pins (210) is shown, and much of its length is indicated in dashed lines, since the length has been exaggerated to present a clear view of the conductive circuit layers (204–206). The conductive path extends through the first contact pad (207), through the fuse, to the second contact pad (209).

At this point, the conductive pin (210) makes electrical contact with the contact pad (209), and extends the conductive path in the direction of a second conductive circuit layer (205). For this particular conductive path, the second conductive circuit layer (205) is not involved, so the opening in the contact pad (211) through which the conductive pin (210) traverses has been enlarged so that the pin (210) does not make electrical contact at this point. Note also that the second conductive circuit layer (205) has had both sets of electrical contacts (103–104) removed by a shearing operation, since these contacts are not needed in this example.

The conductive path continues via the conductive pin (210) to a bottom conductive circuit layer (204), where the pin makes electrical contact with the contact pad (212) through which it passes. The shaded area (213) of the bottom conductive circuit layer (204) has been electrically isolated from the surrounding portions by removal of the conductive traces that originally connected adjacent contact pads around the periphery of the shaded area (213). The conductive path continues to an electrical contact (103) extending outwardly from the conductive circuit layer, through which power may now be distributed via an external distribution network that connects to the electrical contact (103) via a mating connector and cable assembly (not shown).

FIG. 2(f) is an alternative representation of conductive circuit layout. Power is applied to an electrical contact (104) on an upper circuit layer (206), where it is distributed to a middle layer (205) by the conductive pin arrangement described above (all pins not shown, for the sake of clarity). From a contact pad on the middle layer (205), power is distributed over the contact pads shown in the shaded area (220), where power is fed back to the top layer (206) through a set of contact pads (226 and 221) connected by a conductive pin (not shown). A fuse or other suitably spaced component can then be placed between contact pads 221 and 227, using a the electrical terminals in which the pins terminate, as described above, with output power proceeding to one to the electrical contacts (223) at the edge of the circuit layer. Power is also fed through to the top circuit layer to contact 222, where it is applied to a relay package (224), which is shown schematically. When a control signal (electrical ground) is applied to the appropriate relay contact through the input electrical connector (225), the relay energizes, and the output voltage appears at the appropriate output contact (228).

Figure 3A:
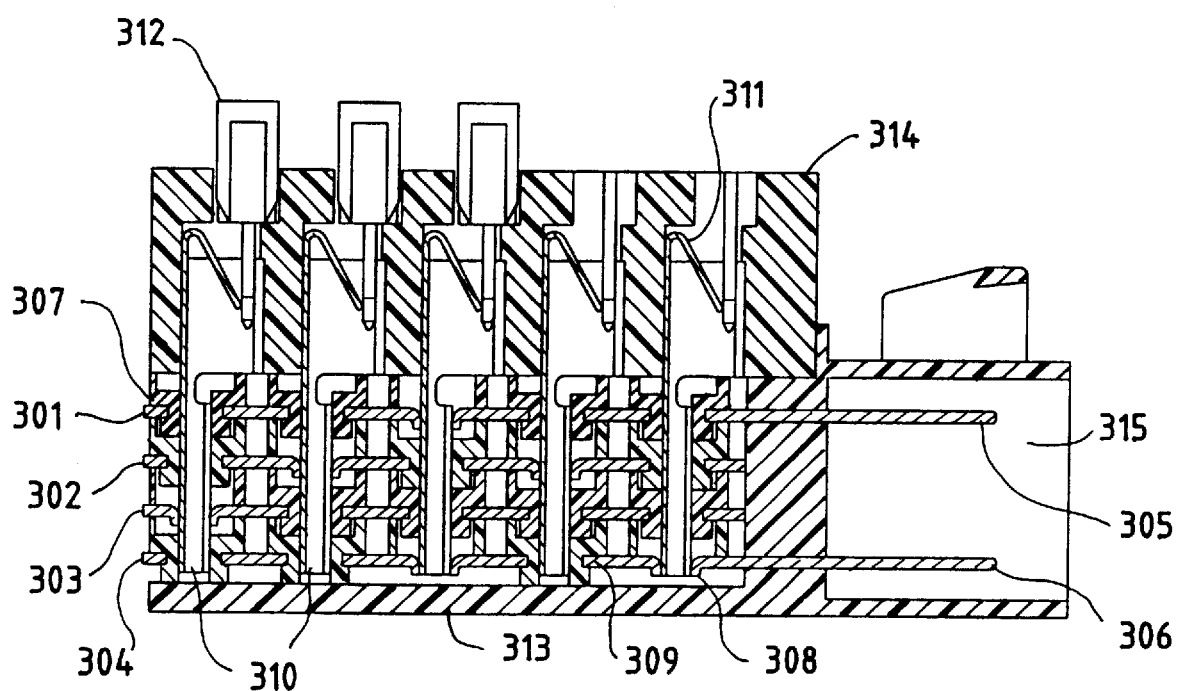
FIG. 3(a) is a side section view of vertically stacked conductive circuit layers in a housing.

The assembly views of FIG. 3 further serve to illustrate a complete assembly of conductive circuit layers. In FIG. 3(a), four conductive circuit layers (301–304), complete with associated insulating material (307, for example), are stacked vertically, with a plurality of conductive pins or connectors (310) providing electrical contact between selected contact pads of different selected conductive circuit layers. Some of the openings (such as 309) previously described in the central portions of the contact pads are made substantially larger than the outside diameter of the conductive pins (310), so that no electrical contact will be made with the associated pin. Other openings (308) are actually extruded slightly, as shown, so that the pin is an interference fit in the opening, and good mechanical contact, as well as electrical contact, can be made between contact pad and pin. After the pins are inserted through the openings in the contact pads, they are soldered to each pad with which they come into contact.

Selected conductive pins can be provided with electrical connectors on at least one end. In FIG. 3(a), each of the pins (310) is shown with an electrical connector (311) at one end. The electrical connector (311) shown in this view is integrally formed as a part of the pin, but the connector could be formed in alternative ways (to be discussed below). Various electrical components (312), fuses in this illustration, are shown mounted so that the components (312) make electrical contact with the electrical connectors (311). It should be noted that the inventive distribution apparatus is designed to accommodate various electrical components used in vehicle electric power distribution systems, including, but not limited to: maxi-fuses or circuit breakers, mini-relays, micro-relays, and minifuses or circuit breakers. All of these component types are well-known in the automotive arts. In addition, since various component spacings are accommodated by the arrangement of contact pads on the conductive circuit layers, and because various designs of pins and associated electrical connectors are contemplated by the invention, virtually any automotive electrical component that might be a useful part of such an electric power distribution system, whether extant or yet to be developed, can be accommodated.

FIG. 3(a) also shows a housing, in this view composed of a bottom portion (313) and a top portion (314), that substantially surrounds the vertically stacked conductive circuit layers. The housing shown is manufactured of thermoplastic polyester, 30% glass filled. Of course, other housing geometries and materials are possible. The housing (313, 314) includes an opening (315) designed to accommodate connection with an external electrical power distribution network. In this case, the opening (315) is designed to accommodate a connector housing (not shown) containing. electrical connectors designed to mate with electrical contacts (305, 306) integrally formed with the conductive circuit layers. The connector housing may include a wiring harness for routing of input or output power.

Figure 3B:
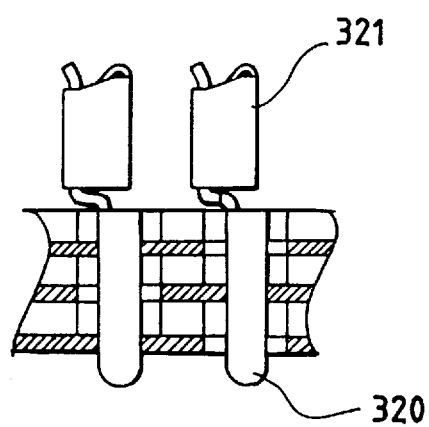
FIG. 3(b) is a stylized sectional depiction of conductive pins penetrating the conductive circuit layers.

FIG. 3(b) is a somewhat stylized representation of conductive pins in an alternative arrangement. Each pin (320) has a terminal spring or cap (321) that is separately manufactured, and is attached to the elongated pin portion (320) by mechanical means (such as a snap-fit), or by brazing, soldering, or similar well-known technique.

Figure 4A:
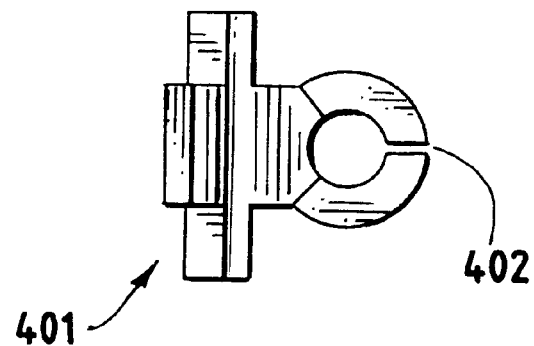
FIGS. 4(a)–(c) are top, side, and rear views, respectively; of a pin terminal suitable for use with the present invention.
Figure 4C:
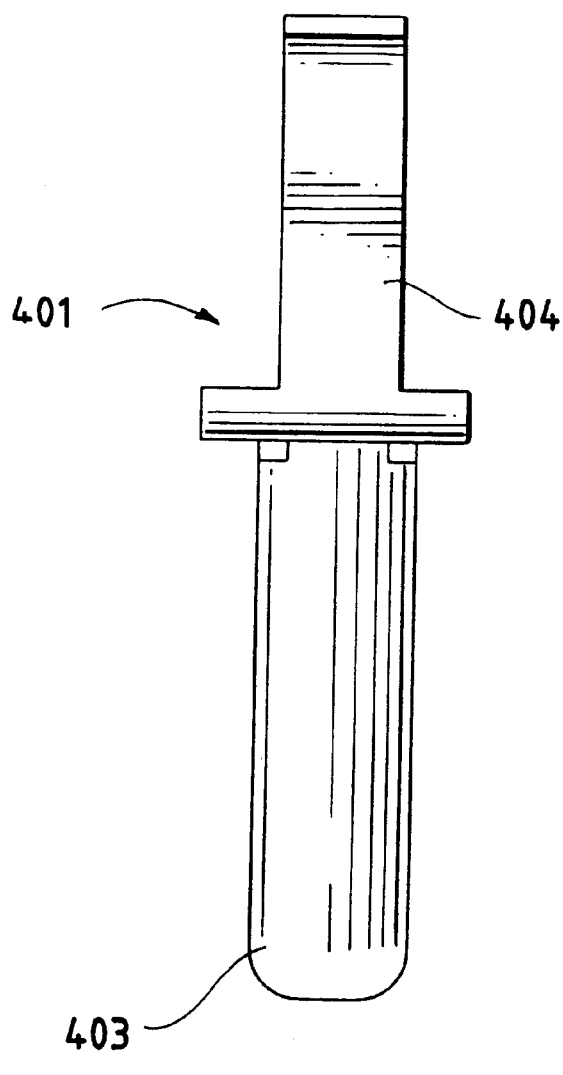
Figure 4B:
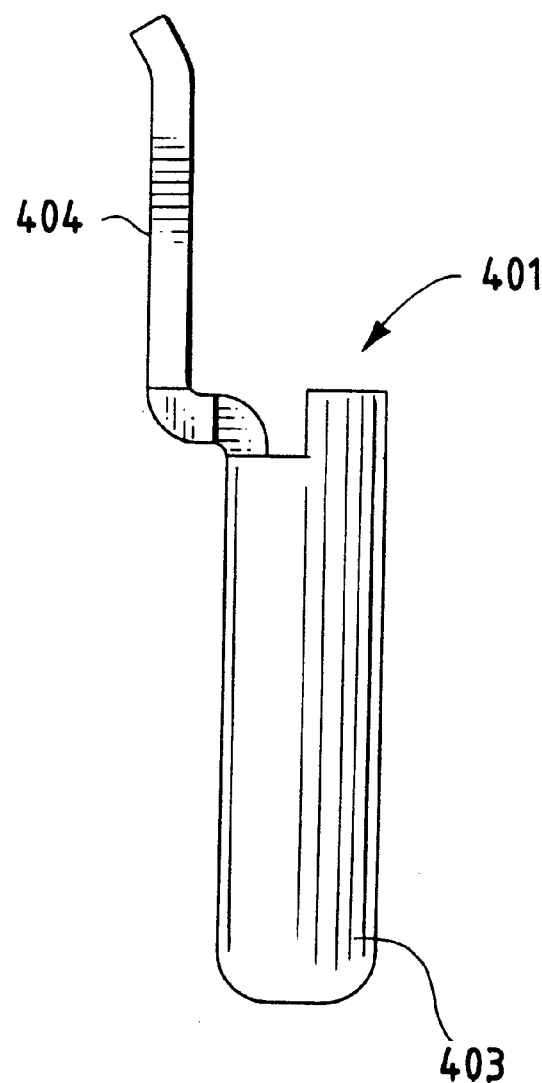

FIGS. 4 and 5 show the details of the multiple-piece conductive pin design. FIG. 4(a) is a top view of the pin terminal (401), in which details of its construction can be seen. The tubular lower portion (403) of the pin terminal is formed by a stamping operation that causes the material of the lower portion to be rolled into a nearly circular cross section, thus leaving a longitudinal slot (402) extending throughout the entire length of the lower body (403) of the pin (401). The extreme lower portion is also slightly rounded by the forming operation, leaving a hole in the pin, at the bottom, that is slightly smaller than the inside diameter of the rolled structure. FIGS. 4(b) and (c) are side and rear elevational views, respectively, showing the geometry of the upper portion. (404) of the pin (401). Preferably, the pin terminal (401) is fabricated from 0.028±0.0005 CDA 110 half hard copper, with 0.0002/0.0004 inch solder plate (which may be preplated stock). Of course, the foregoing discussion should not be interpreted to preclude the use of other materials and geometries.

Figure 5A:
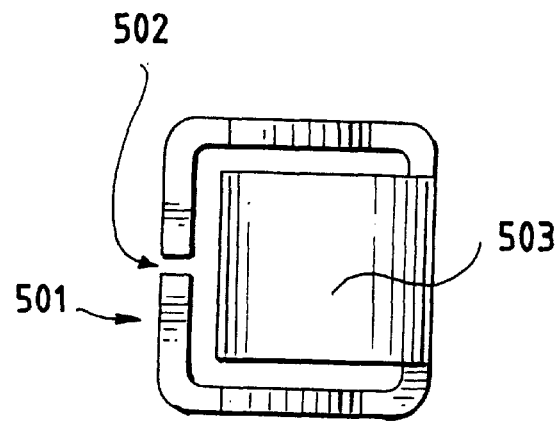
FIGS. 5(a)–(c) are top, side, and front views of a terminal spring suitable use with the pin terminal of FIG. 4.
Figure 5C:
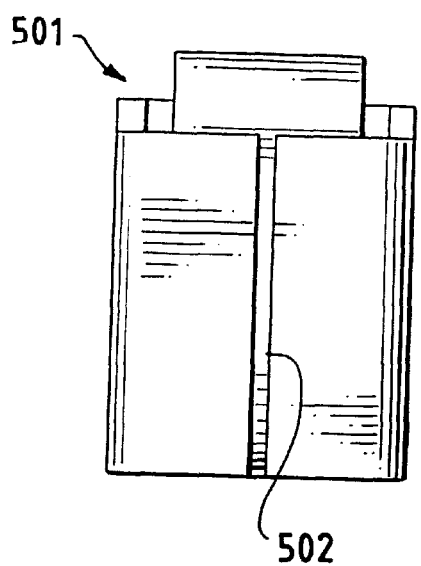
Figure 5B:
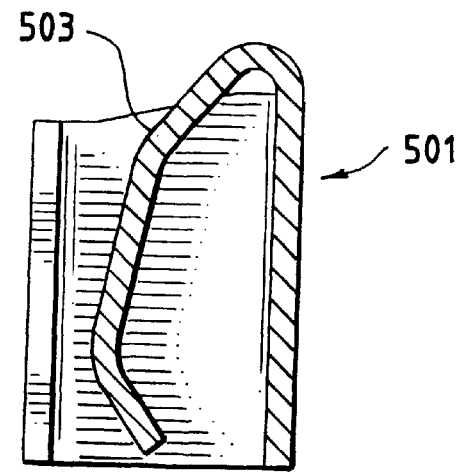

FIG. 5 shows details of construction of a terminal spring designed to operate in conjunction with the pin terminal just described. The terminal spring fits snugly on the pin terminal to provide a secure mechanical and electrical connection. Preferably, the terminal spring (501) is constructed of stainless steel, so that the integrally formed spring member (503) will provide the requisite contact force to mating electrical connectors. Because of the method of its fabrication, the terminal spring also includes a slot (502) extending longitudinally over its full length. FIG. 5(a) is a top view, while FIG. 5(b) is a side section view and FIG. 5(c) is a front view of the terminal spring.

Figure 6:
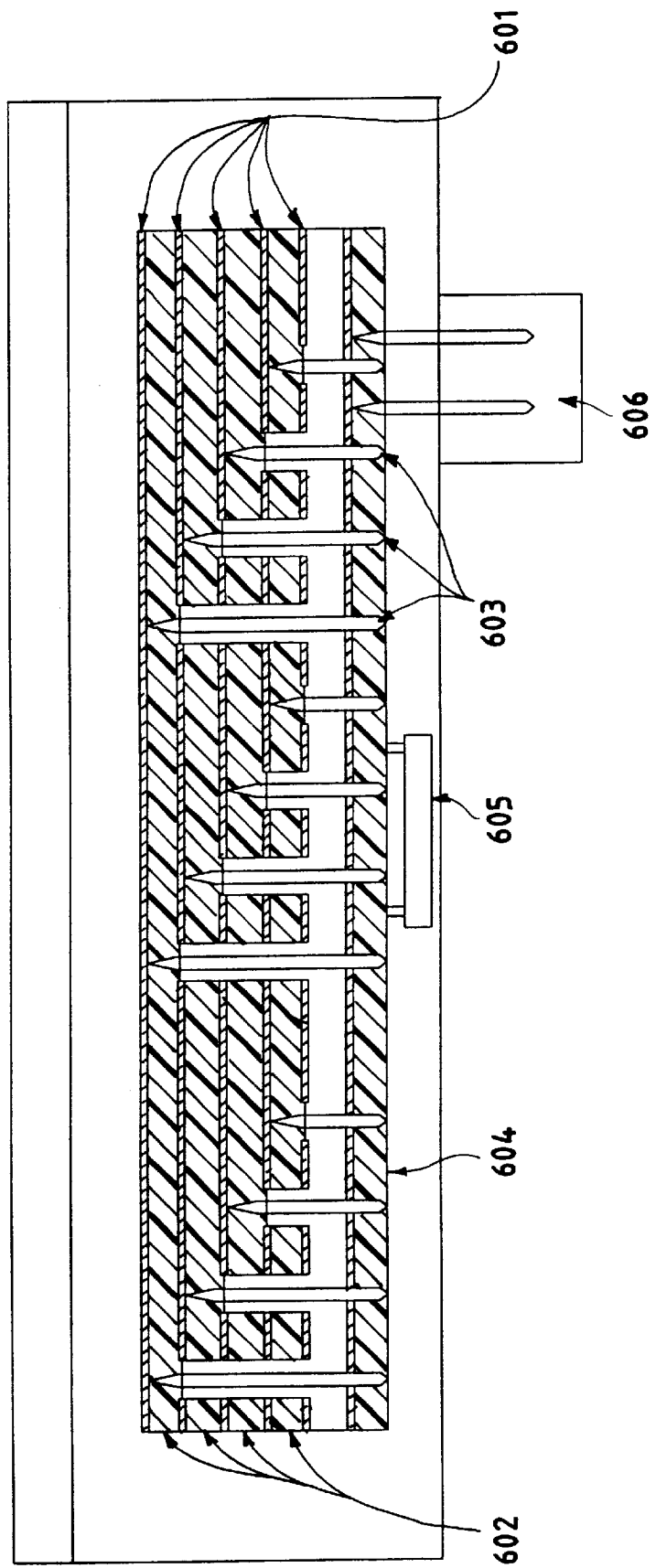
FIG. 6 is a stylized section view of an electric power distribution apparatus showing interconnection with a circuit board.

Yet another inventive feature is visible in FIG. 6, a somewhat stylized depiction of the electric power distribution apparatus. The distribution apparatus illustrated shows five conductive circuit layers (601) separated by layers of insulating material (602), with conductive pins (603) providing electrical contact between selected contact pads of different selected conductive circuit layers. This embodiment illustrates that some of the conductive pins (603) terminate before penetrating all conductive layers, in contrast. to what has been shown and described with reference to the other pertinent drawing figures. Also attached to the conductive pins is a printed circuit board of conventional design. The printed circuit board, in addition to supporting electronic components (605) (such as integrated circuits, resistors, capacitors, etc.), the printed circuit board may also include one or more connectors (606) for providing power or other electronic signal input and output. Thus, the electric power distribution described herein can easily be interfaced with a range of electronic components, and the entire assembly can be placed in a housing, creating a rugged electronic module for vehicle installation that can support data logging, digital electronic control features, etc.

The inventors have described herein an electric power distribution apparatus that is inexpensive to produce, easily adapted for specific model applications, and durably packaged. Although several of the inventive features are described with particularity in the appended claims, it should be understood that there may be variations of the inventive concept that, while not explicitly claimed, nonetheless fall within the spirit and scope of the invention.

What is claimed is:

1. A vehicle electric power distribution apparatus comprising:

a plurality of vertically stacked conductive circuit layers at least partially coated with an electrically insulating material, each layer including an array of contact pads, and at least some of the contact pads are electrically connected to selected other contact pads of the same conductive circuit layer via integrally formed conductive traces; and a plurality of conductive pins providing electrical contact between selected contact pads of different selected conductive circuit layers.

2. The apparatus of claim 1, wherein the electrically insulating material is plastic.

3. A vehicle electric power distribution apparatus comprising:

a plurality of vertically stacked conductive circuit layers, each layer including an array of contact pads, each of the conductive circuit layers is at least partially encapsulated by an electrically insulating material, and at least some of the contact pads are electrically connected to selected other contact pads of the same conductive circuit layer via integrally formed conductive traces;

a plurality of conductive pins providing electrical contact between selected contact pads of different conductive circuit layers.

4. The apparatus of claim 3, wherein the electrically insulating material covers substantially all of the conductive circuit layer, except for at least a portion of the contact pads and at least a portion of the conductive traces.

5. A vehicle electric power distribution apparatus comprising:

a plurality of vertically stacked conductive circuit layers, each layer including an array of contact pads, at least one of the conductive circuit layers includes at least one integrally formed electrical contact coplanar therewith, and at least some of the contact pads are electrically connected to selected other contact pads of the same conductive circuit layer via integrally formed conductive traces;

a plurality of conductive pins providing electrical contact between selected contact pads of different selected conductive circuit layers, and the contact extending outwardly from the conductive circuit layer, making electrical contact with at least one of the contact pads, and arranged to provide electrical contact with an external electric power distribution network.

6. An electric power distribution apparatus comprising:

a plurality of conductive plates including contact pads arranged in a predetermined pattern, wherein at least some of the contact pads are electrically connected to selected other contact pads via integrally formed conductive traces;

a plurality of conductive pins providing electrical contact between selected contact pads of different selected conductive plates.

7. The apparatus of claim 6, wherein the contact pads are arranged in a rectangular array.

8. The apparatus of claim 7, wherein the array is square, and the contact pads are separated by a center-to-center distance of about 0.320 inch.

9. The apparatus of claim 6, wherein the conductive pins include a lower tubular portion and an upper connector portion.

10. The apparatus of claim 9, wherein the lower tubular portion is formed by a stamping operation which further forms a longitudinal slot extending substantially throughout the lower tubular portion.

11. The apparatus of claim 9, wherein the lower tubular portion and the upper connector portion are integrally formed.

12. The apparatus of claim 6, wherein the conductive plates are fabricated from conductive material having a thickness of from 0.020 to 0.050 inch.

13. The apparatus of claim 12, wherein the conductive material is copper.

14. The apparatus of claim 6, wherein the conductive plates are formed by a stamping operation.

15. The apparatus of claim 6, wherein the conductive plates are at least partially coated with an insulating material.

16. The apparatus of claim 6, wherein the conductive plates are stacked vertically.

17. An electric power distribution apparatus comprising:

a plurality of conductive plates stacked vertically, wherein the conductive plates are:

formed by a stamping operation to include an arrangement of contact pads wherein at least some of the contact pads are connected to adjacent contact pads by integrally formed conductive traces, and such that the conductive plates are substantially identical after stamping;

at least partially coated with an insulating material such that the conductive plates are electrically isolated from one another; and subjected to a subsequent shearing operation to selectively remove undesired conductive traces to form desired conductive paths, thus rendering each conductive plate substantially unique from other conductive plates;

a plurality of conductive pins providing electrical contact between selected contact pads of different selected, vertically stacked conductive plates.

* * * * *